(12) United States Patent
Kaald

(10) Patent No.: US 8,760,331 B2
(45) Date of Patent: Jun. 24, 2014

(54) CONTINUOUS TIME DELTA SIGMA CONVERTER HAVING A VCO BASED QUANTIZER

(75) Inventor: Rune Kaald, Trondheim (NO)

(73) Assignee: Hittite Microwave Norway AS, Tiller (NO)

( * ) Notice: Subject to any disclaimer, the term of this patent is extended or adjusted under 35 U.S.C. 154(b) by 0 days.

(21) Appl. No.: 13/542,691

(22) Filed: Jul. 6, 2012

(65) Prior Publication Data
US 2013/0187803 A1 Jul. 25, 2013

Related U.S. Application Data

(60) Provisional application No. 61/632,244, filed on Jan. 20, 2012.

(51) Int. Cl.
*H03M 3/00* (2006.01)

(52) U.S. Cl.
USPC .......................................... 341/143; 341/155

(58) Field of Classification Search
USPC .................................. 341/143, 155, 156, 172
See application file for complete search history.

(56) References Cited

U.S. PATENT DOCUMENTS

| | | | |
|---|---|---|---|
| 6,462,687 B1 | 10/2002 | Eshraghi et al. | |
| 7,405,687 B2 | 7/2008 | Mitteregger et al. | |
| 7,994,958 B2 * | 8/2011 | Quiquempoix et al. | 341/150 |
| 8,077,066 B2 * | 12/2011 | Niwa et al. | 341/143 |
| 2007/0171109 A1 | 7/2007 | Mitteregger | |

OTHER PUBLICATIONS

Xinpeng Xing et al. "A 40 MHz 12 bit 84.2dB-SFDR Continuous-Time Delta-Sigma Modulator in 90nm CMOS", IEEE Asian Solid-State Circuits Conference, Nov. 14-16, 2011, Jeju, Korea, pp. 249-252.

Matthew Park and Michael H. Perrott, "A 78 dB SNDR 87 mW 20 MHz Bandwidth Continuous-Time ΔΣ ADC With VCO-Based Integrator and Quantizer Implemented in 0.13 μm CMOS", IEEE Journal of Solid-State Circuits, vol. 44, No. 12, Dec. 2009, pp. 3344-3358.

Dörrer et al., "A 3-mW 74-dB SNR 2-MHz Continuous-Time Delta-Sigma ADC With a Tracking ADC Quantizer in 0.13-μm CMOS", IEEE Journal of Solid-State Circuits, vol. 40, No. 12, Dec. 2005, pp. 2416-2427.

Mitteregger, et al., "A 20-mW 640-MHz CMOS Continuous-Time ΣΔADC With 20-MHz Signal Bandwidth, 80-dB Dynamic Range and 12-bit ENOB", IEEE Journal of Solid-State Circuits, vol. 41, No. 12, Dec. 2006, pp. 2641-2649.

* cited by examiner

*Primary Examiner* — Joseph Lauture
(74) *Attorney, Agent, or Firm* — Iandiorio Teska & Coleman, LLP

(57) ABSTRACT

A continuous-time delta sigma converter includes a loop filter having a plurality of serially coupled integrators including a first integrator responsive to an input of the Delta Sigma converter and a last integrator responsive to a first feedback loop and providing an integrated output signal, and a voltage controlled oscillator (VCO) based quantizer responsive to the loop filter for integrating the integrated output signal and providing a digital output signal. The first feedback loop includes a first time delay circuit responsive to the output of the quantizer and at least one switched capacitor digital to analog converter (DAC) responsive to the first time delay circuit. The first feedback loop is configured to differentiate the digital output signal twice and provide the last integrator of the loop filter with a double differentiated analog signal to reduce excess loop delay.

23 Claims, 6 Drawing Sheets

CONTINUOUS TIME DELTA SIGMA CONVERTER HAVING A VCO BASED QUANTIZER

RELATED APPLICATIONS

This application hereby claims the benefit of and priority to U.S. Provisional Application Ser. No. 61/632,244, filed on Jan. 20, 2012, under 35 U.S.C. §§119, 120, 363, 365, and 37 C.F.R. §1.55 and §1.78, which application is incorporated herein by reference.

FIELD OF THE INVENTION

This invention relates to a continuous-time delta sigma converter.

BACKGROUND OF THE INVENTION

A typical continuous time delta sigma analog-to-digital converter includes a loop filter, a clocked quantizer and one or more feedback digital-to-analog (DAC) converters. Ideally, when the quantizer is toggled, the feedback DACs should output a signal instantaneously. In practice, this is not possible due to finite switching times which introduce an unavoidable delay in the quantizer and the feedback DACs. This effect is known as excess loop delay. To compensate for this, a direct feedback path from the output may be input to a node between the loop filter and the quantizer. Examples of continuous time delta sigma converters are disclosed in U.S. Pat. No. 7,405,687 and U.S. Patent Publ. No. 2007/0171109, which are herein incorporated by reference.

When a multiphase voltage controlled oscillator (VCO) is used as a quantizer and integrator, the excess loop delay becomes even more problematic because a VCO based quantizer will also integrate its input signal.

Another problem is the need for summation of multiple signals originating from one more integrators in the loop filter or feedback paths from the quantizer. A conventional prior active summing circuit may include a resistive summation amplifier, having one or more resistive inputs in conjunction with current steering DACs. The bandwidth of this arrangement is ideally given by the feedback factor, which is set by the ratio of the feedback, and total input and feedback resistances, multiplied by the unity gain-bandwidth of the amplifier.

Another prior passive summing circuit has current from the feedback DACs generate a voltage when passing thru resistances such as the equivalent resistance Req seen at the input node of the VCO due to one or possibly multiple resistive paths from the loop filter, realizing a summing point.

Common for both prior summing solutions is that the feedback coefficients are realized by $I_{DAC}*R$, where R would be the amplifier feedback resistance or the equivalent resistance Req. While the latter approach has the potential for high power effectiveness, it has the disadvantage that parasitic capacitance associated with the input of the VCO, routing and DAC current sources form a pole in conjunction with the equivalent summing resistance.

An equivalent situation may arise with the former approach when a pole is formed at the inputs of the amplifier due to the parasitic capacitance associated with this node. In addition, the amplifier itself has a pole due to its finite bandwidth. Careful layout and optimization of the amplifiers' input capacitance maximizes the bandwidth. Nevertheless, to achieve wide bandwidth, the value of the resistors in the amplifier feedback network is preferably set low. However, this increases the power consumption and the small input resistors will also reduce the gain in the preceding integrators.

Another concern with the two previous summing solutions is with the current steering feedback DACs. The digital bits, which may have unitary coding, should arrive before the controlling edge of the clock signal. This is because a flip-flop or latch is used with each current cell. The setup-time of the logic is dependent on the type of logic used. If the setup time is violated because one of the current cells changes its output at a different point in time than the other current cells, noise degradation occurs in the continuous time delta sigma modulator.

Another concern for a continuous time delta sigma modulator is the delay from when the controlling edge of a clock signal arrives to a cell to when the updated current cells provides an output. At high operating frequencies relative to the maximum transistor switching speed, delay from a single logic block can be significant with respect to the sampling period, and if the logic block a part of the modulator feedback loop, the excess loop delay is increased. In conjunction with the parasitic poles from the aforementioned solutions, this also jeopardizes the stability of the modulator.

SUMMARY OF THE INVENTION

In accordance with various aspects of the subject invention, in at least one embodiment the invention presents a continuous-time delta sigma converter that reduces excess loop delay.

The subject invention results from the realization that, in part, an improved continuous-time delta sigma converter that in various aspects reduces excess loop delay can be achieved by the use of a feedback loop from the output of a voltage controlled oscillator (VCO) based quantizer to the input of the last integrator of a loop filter before the VCO based quantizer, in which the feedback loop includes a delay circuit and at least one switched capacitor digital to analog converter (DAC) that together differentiate the digital output signal from the quantizer twice and provide the last integrator with a double differentiated analog signal.

The subject invention, however, in other embodiments, need not achieve all these objectives and the claims hereof should not be limited to structures or methods capable of achieving these objectives.

This invention features a continuous-time delta sigma converter, including a loop filter including a plurality of serially coupled integrators including a first integrator responsive to an input of the Delta Sigma converter and a last integrator responsive to a first feedback loop and providing an integrated output signal; and a voltage controlled oscillator (VCO) based quantizer responsive to the loop filter for integrating the integrated output signal and providing a digital output signal. The first feedback loop includes a first time delay circuit responsive to the output of the quantizer and at least one switched capacitor digital to analog converter (DAC) responsive to the first time delay circuit, the first feedback loop configured to differentiate the digital output signal twice and provide the last integrator of the loop filter with a double differentiated analog signal to reduce excess loop delay.

In one embodiment, the at least one switched capacitor DAC includes a first switched capacitor DAC responsive to the first time delay circuit, and a second switched capacitor DAC responsive to the output of the quantizer. The first time delay circuit may delay the output signal from the quantizer by approximately half clock cycle. The loop filter may second and third integrators coupled in series between the first and last integrators. The loop filter may include one or more feedforward capacitances coupled to the output of the loop filter. The loop filter may include three feedforward capacitances each coupled between an input of one of the three integrators and the output of the loop filter. The loop filter may include a resonator stage. The delta sigma converter may include a second feedback loop coupled between the output of the quantizer and an input of the loop filter, the second feedback loop including a current steering DAC responsive to the quantizer. The second feedback loop may further include a second time delay circuit coupled between the quantizer and the current steering DAC for delaying the output signal from the quantizer by approximately half of a clock cycle Each switched capacitor DAC may include a plurality of switches each responsive to a reference voltage, a plurality of capacitances each responsive to at least one of the plurality of switches, and at least one output switch responsive to the plurality of capacitances and a clock signal for providing an output signal from the switched capacitor DAC. Each of the capacitances may be responsive to first and second switches which are respectively responsive to first and second reference voltages. The first switch may be clocked by an output bit of the quantizer and the second switch may be clocked by a complementary signal of the output bit. Each switch may include an inverter responsive to an output of the quantizer, the reference voltage may be a supply voltage for the inverter, and each of the capacitances may be responsive to a corresponding inverter.

This invention also features a continuous-time delta sigma converter, including a loop filter including four serially coupled integrators including a first integrator responsive to an input of the Delta Sigma converter and a fourth integrator responsive to a first feedback loop and providing an integrated output signal; and a voltage controlled oscillator (VCO) based quantizer responsive to the loop filter for integrating the integrated output signal and providing a digital output signal. The first feedback loop is configured to differentiate the digital output signal twice and provide the fourth integrator with a double differentiated analog signal to reduce excess loop delay. The first feedback loop includes: a first time delay circuit responsive to the output of the quantizer, a first switched capacitor DAC responsive to the first time delay circuit, and a second switched capacitor DAC responsive to the output of the quantizer.

In another embodiment, the first time delay circuit may delay the output signal from the quantizer by approximately half a clock cycle. The first time delay circuit may differentiate the digital output signal in a discrete time domain and the first and second switched capacitor DACs may differentiate in a continuous time domain. The loop filter may include one or more feedforward capacitances coupled to the output of the loop filter. The three feedforward capacitances each may be coupled between an input of one of the three integrators and the output of the loop filter. The delta sigma converter may include a second feedback loop coupled between the output of the quantizer and an input of the loop filter, the second feedback loop including a current steering DAC responsive to the quantizer. The second feedback loop may further include a second time delay circuit coupled between the quantizer and the current steering DAC for delaying the output signal from the quantizer by approximately half of a clock cycle.

This invention also features a switched capacitor digital to analog converter (DAC) responsive to a quantizer in a feedback loop of a continuous-time delta sigma converter, the switched capacitor DAC including a plurality of switches each responsive to a reference voltage, a plurality of capacitances each responsive to at least one of the plurality of switches, and at least one output switch responsive to the plurality of capacitances and a clock signal for providing an output signal from the switched capacitor DAC.

In another embodiment, the capacitances may be responsive to first and second switches which are respectively responsive to first and second reference voltages. The first switch may be clocked by an output bit of the quantizer and the second switch may be clocked by a complementary signal of the output bit. There may be only one output switch. Each switch may include an inverter responsive to an output of the quantizer, the reference voltage may be a supply voltage for the inverter, and each of the capacitances may be responsive to a corresponding inverter.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
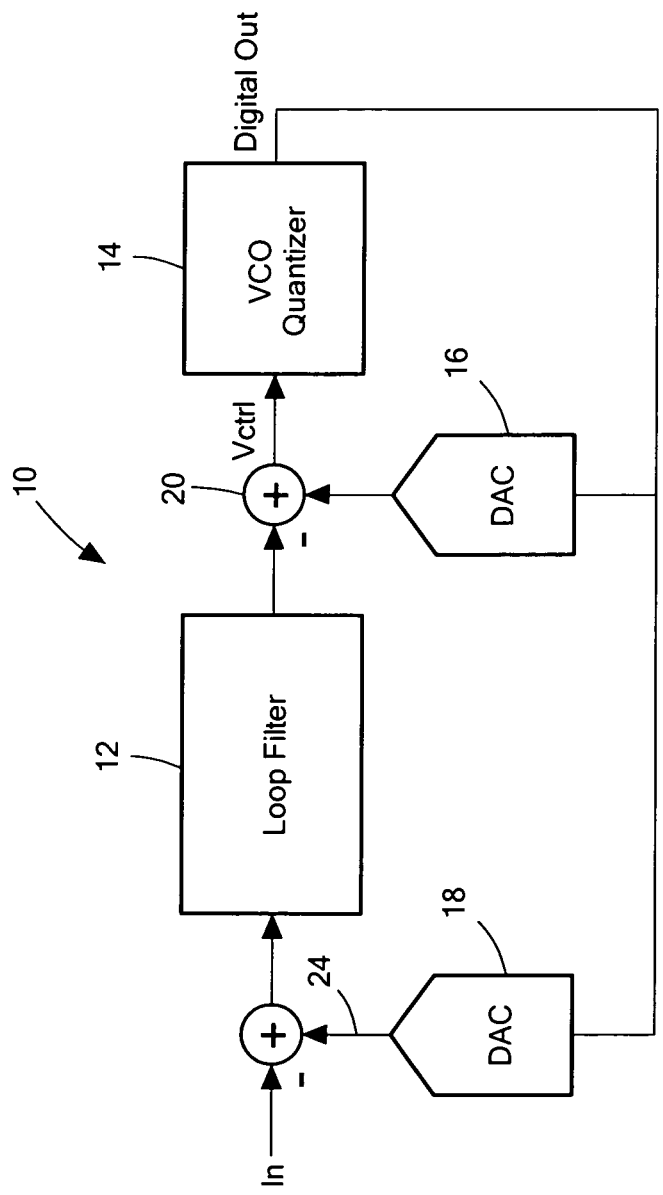
FIG. 1 is a circuit diagram of a prior art continuous-time delta sigma analog-to-digital converter that includes a VCO based quantizer.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

A typical continuous time delta sigma analog-to-digital converter 10, FIG. 1, includes a loop filter 12, a clocked quantizer 14 and one or more feedback digital-to-analog (DAC) converters 16 and 18. As described above in the Background of the Invention, when quantizer 14 is toggled feedback DACs 16 and 18 should ideally output a signal instantaneously. In practice, this is not possible due to finite switching times which introduce an unavoidable delay in quantizer 14 and feedback DACs 16 and 18. This effect is known as excess loop delay. To compensate for this, a direct feedback path from the output may be input to a node or summing circuit 20 between the loop filter and the quantizer.

When a multiphase voltage controlled oscillator (VCO) is used as a quantizer and integrator, however, the excess loop delay may become greater and more problematic because a VCO based quantizer will also integrate its input signal.

Another problem is the need for summation of multiple signals originating from one more integrators in the loop filter or feedback paths from the quantizer. A conventional prior active summing circuit 22, FIG. 2, includes a resistive summation amplifier 24, having one or more resistive inputs 26a . . . n and 28a . . . n, and a feedback loop 27 from the output of VCO 29. Feedback loop 27 includes current steering DACs 30 and 32 and time delay circuit 34. The bandwidth of this arrangement is ideally given by the feedback factor, which is set by the ratio of the feedback, and total input resistance from resistors 26a . . . n and 28a . . . n and feedback resistances from resistors 36 and 38, multiplied by the unity gain-bandwidth of amplifier 24.

Figure 3:
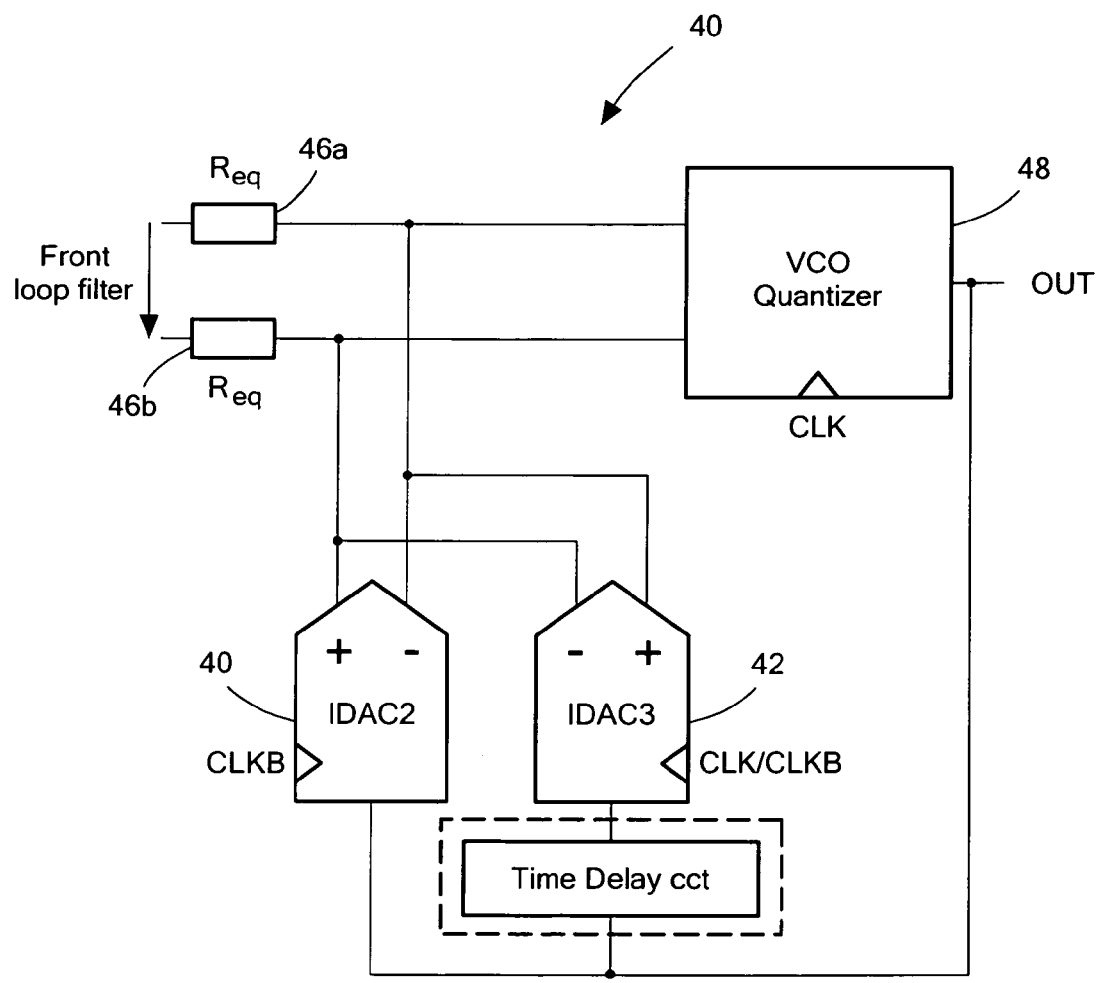
FIG. 3 is a circuit diagram of another prior art summation circuit for use with a VCO based quantizer in a continuous-time delta sigma converter.

In another prior passive summing circuit 40, FIG. 3, feedback current from current steering DACs 42 and 44 generates a voltage when passing thru resistances such as the equivalent resistances 46a and 46b seen at the input node of VCO 48 due to one or possibly multiple resistive paths from the loop filter (not shown), realizing a summing point.

Figure 2:
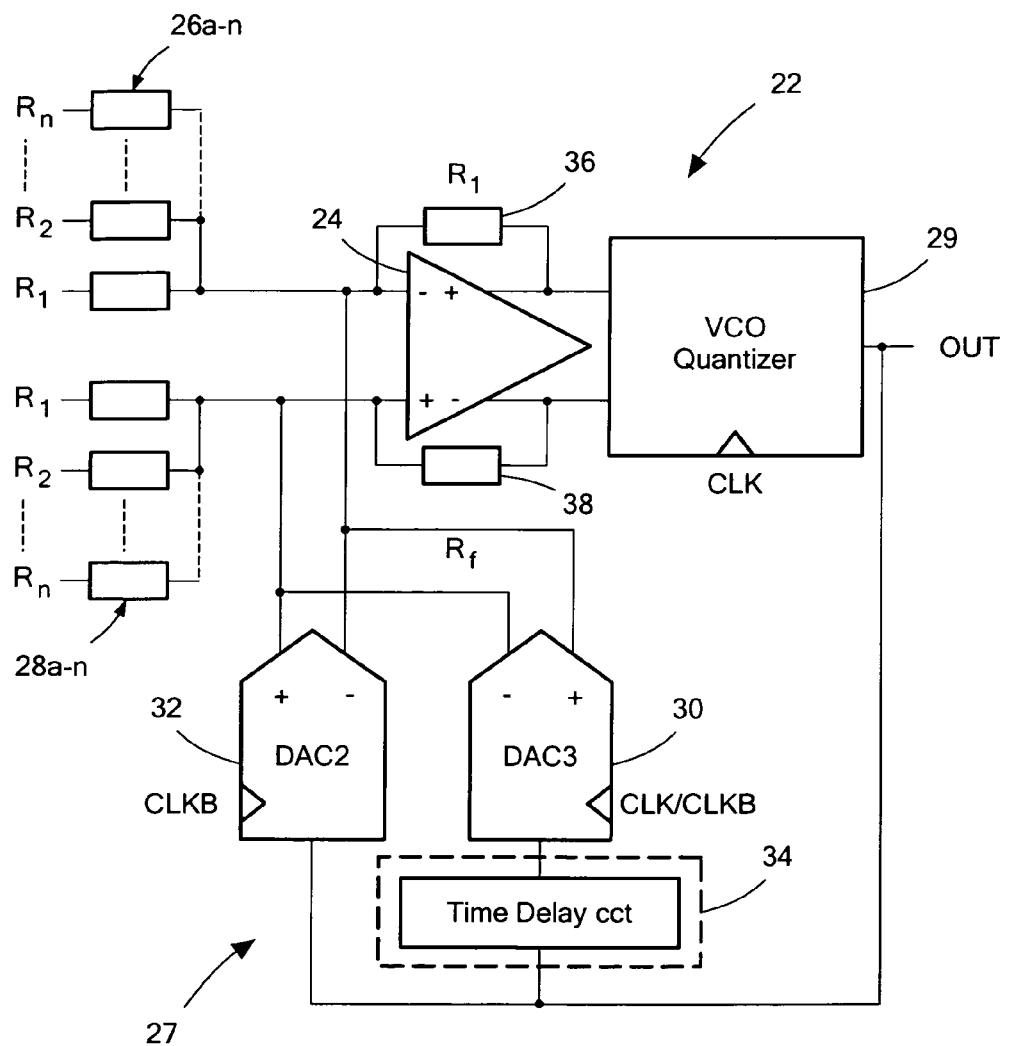
FIG. 2 is a circuit diagram of a prior art summation circuit for use with a VCO based quantizer in a continuous-time delta sigma converter.

As described above, however, there are disadvantages associated with the use of the summing circuits of FIGS. 2 and 3, including the formation of a parasitic pole, increased power consumption, reduced gain in the preceding integrators and/or increased loop delay.

Figure 4:
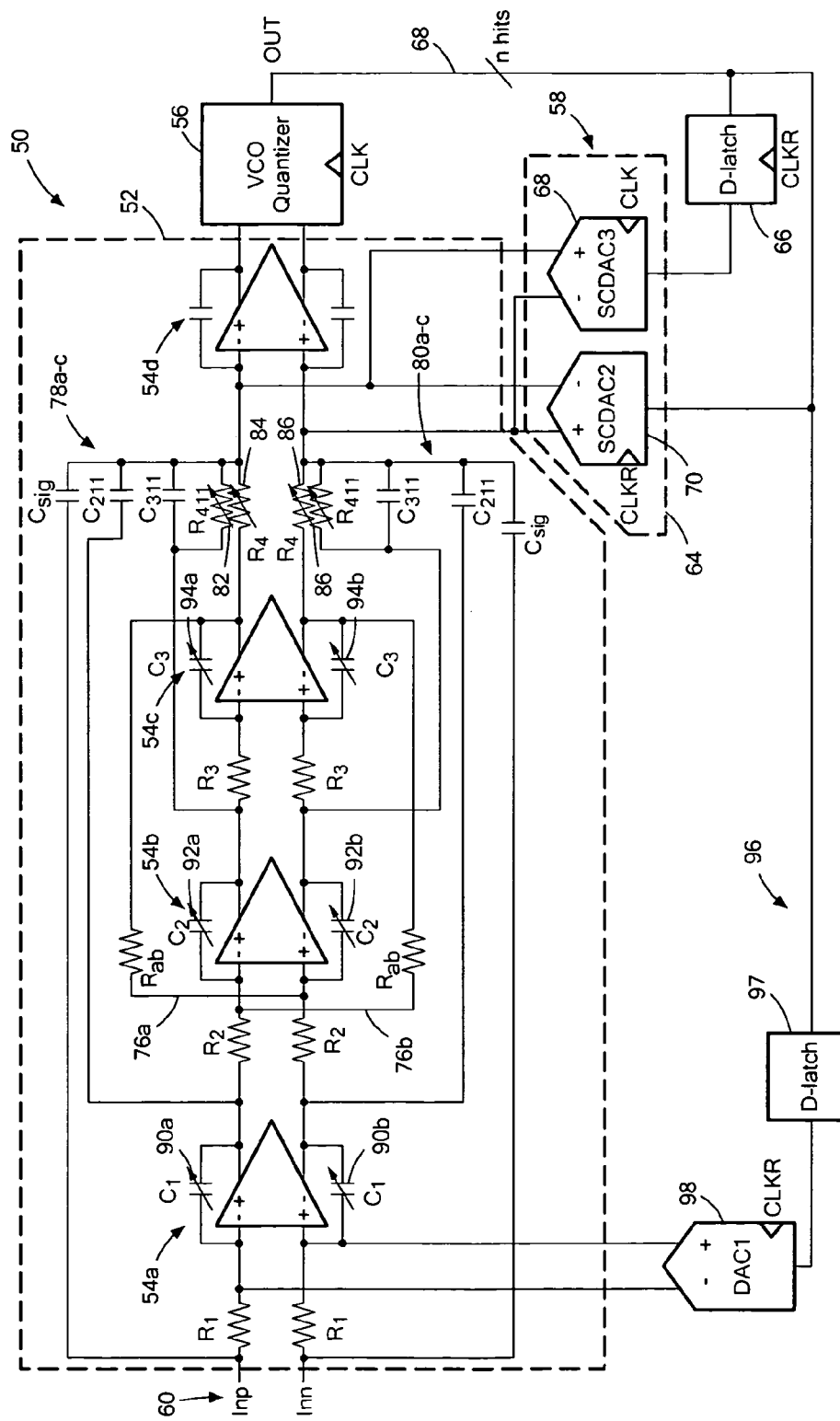
FIG. 4 is a circuit diagram of a continuous-time delta sigma converter in accordance with one embodiment of the invention.

There is shown in FIG. 4 a continuous-time delta sigma analog-to-digital (ADC) converter 50 that reduces excess loop delay in accordance with the invention. Delta sigma converter 50 includes a loop filter 52, a voltage controlled oscillator (VCO) based quantizer 56 and a first feedback loop 58. Loop filter 52 includes a plurality of serially coupled integrators 54a-d and is responsive to an input 60 of delta sigma converter 50. In FIG. 4, delta sigma converter 50 is shown as having a differential signal, but this is not a limitation of the invention as the input signal could also be single ended. The last integrator 54d of loop filter 52 is also responsive to a first feedback loop 58 and provides an integrated output signal. Quantizer 56 is responsive to loop filter 52 and provides a digital output signal having n bits on one or more lines denoted by 62. Thermometer coding may be used to provide an output signal having n bits on lines 62.

VCO quantizer 56 integrates its input in terms of phase and is configured to function as an integrator. Thus, VCO quantizer 56 further integrates the integrated output signal output from integrator 54d. First feedback loop 58 is responsive to the output of VCO quantizer 56 and includes a first tune delay circuit 66 responsive to the output of VCO quantizer 56 and at least one switched capacitor DAC 64 responsive to the first time delay circuit. In contrast to the prior art, first time delay circuit 66 and switched capacitor DAC 64 differentiate the digital output signal on line 62 twice to provide integrator 54d with a double differentiated analog signal to reduce excess loop delay.

In the embodiment of delta signal converter 50 shown in FIG. 4, feedback loop 58 includes a time delay circuit 66 to delay the output signal or signals from quantizer 56 by approximately half a clock cycle. Time delay circuit 66 may include, for example, a D-latch circuit to delay the output of VCO quantizer 56 by approximately half a clock cycle. The at least one switched capacitor DAC 58 includes a first switched capacitor DAC 68 responsive to time delay circuit 66, and also includes a second switched capacitor 70 responsive to the output of quantizer 56. Switch capacitor DACs 68 and 70 have their output coupled to the input of integrator 54. In the differential embodiment shown in FIG. 4, switch capacitor DAC 70 has its positive output terminal coupled to the positive input terminal of integrator 54d and has its negative output terminal coupled to the negative input terminal of integrator 54d, while switch capacitor DAC 68 has an opposite output polarity with its positive output terminal coupled to the negative input terminal of integrator 54d and has its negative output terminal connected to the positive input terminal of integrator 54d. In this manner, time delay circuit 66 delays the digital output signal from quantizer 56 and the output of switched capacitor DAC 68 is subtracted from the output of switched capacitor DAC 70 such that differentiation occurs in the discrete time domain. Also, switched capacitor DACs 68 and 70 differentiate in the continuous time domain such that the digital output signal on line 62 is differentiated twice to provide integrator 54d with a double differentiated analog signal to reduce excess loop delay without some or all of the disadvantages of the aforementioned prior art summing circuits.

Loop filter 52 may include any conventional loop filter, but in this embodiment is a fourth order loop filter that includes three integrators 54a-d. A feedback path on lines 76a and 76b from the output of integrator 54c to in the input of integrator 54b creates a resonator stage, such that the gain of loop filter 52 is high and also near the signal band edge. Loop filter 52 also includes one or more feedforward capacitances such as capacitors 78a-c and 80a-c for the summation of signals not being integrated by one of integrators 54a-c.

Since passive devices such as resistors and capacitors may have manufacturing variations, loop filter 52 is preferably tunable to accommodate any manufacturing variations in these components. In loop filter 52, resistors 82-88 coupled to integrator 54c are tunable or variable resistors. Likewise, capacitors 90a and 90b of integrator 54a, capacitors 92a and 92b of integrator 72 and capacitors 94a and 94b of integrator 74 are tunable or variable. Since the tuning of resistors is often associated with the parasitic phase shift, in the embodiment of FIG. 4 only the fourth and fifth order integrators will have their input signals pass through resistors 82-88 because the parasitic phase shifts at this point of the circuit will have less impact on the stability of converter 50.

Delta sigma converter 50 also includes a second feedback loop 96 responsive to the output of VCO output quantizer 56. Second feedback loop 96 includes a delay circuit 97 and a current steering DAC 98 which provides an output to integrator 54a of loop filter 52.

Figure 5:
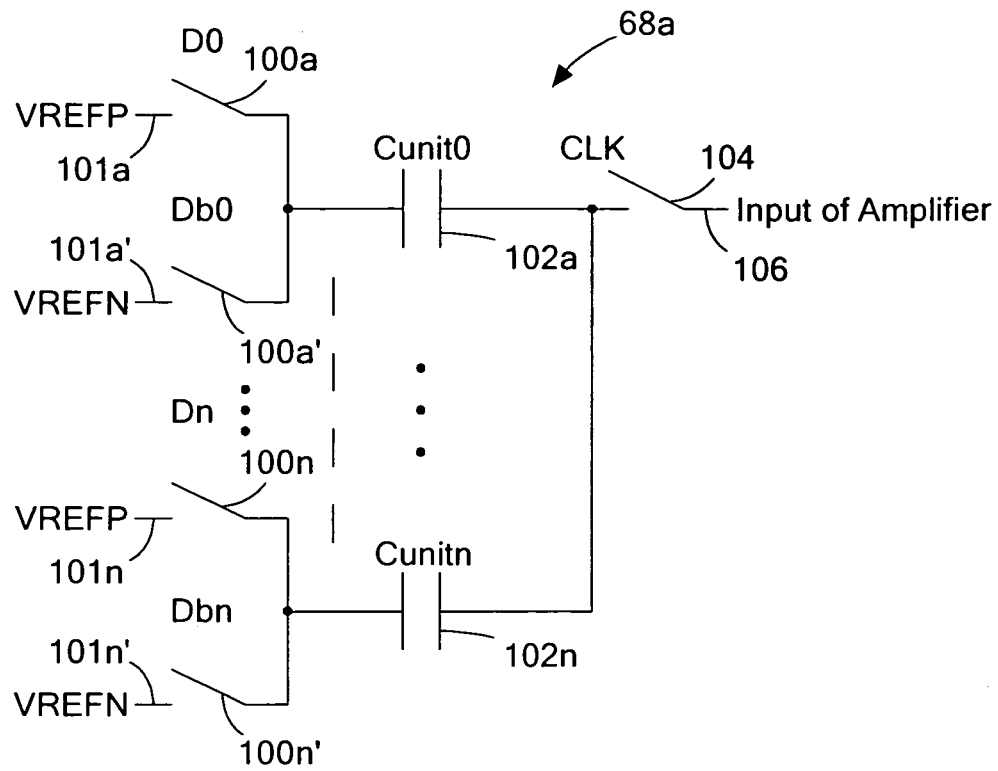
FIG. 5 is a circuit diagram of one embodiment of the switched capacitor DAC used with the continuous-time delta sigma converter of FIG. 4.

One embodiment of a switched capacitor DAC 68a, FIG. 5, includes a plurality of switches 100a . . . 100n and 100a' . . . 100n' which are each responsive to a reference voltage on line 101a . . . 101n or 101a' . . . 101n'. For example, switch 100a is responsive to reference voltage VREFP on line 101a, while switch 100a' is responsive to reference voltage VREFN on line 101a'. Switched capacitor DAC 68 also includes a plurality of capacitances such as capacitors 102a . . . 102n which are responsive to at least one of the plurality of switches. With DAC 68a, for example, capacitor 102a is responsive to two switches 100a and 100a'. At least one output switch 104 is responsive to the plurality of capacitances 102a . . . 102n and is clocked by a clock signal for providing an output signal on line 106 which is provided to one of the inputs of integrator 54d in FIG. 4. Preferably, each capacitor 102a . . . 102n is responsive to first and second switches such as switches 100a and 100a' which are respectively responsive to first and second reference voltages. Each of switches 100a . . . 100n is clocked by an output bit of quantizer 56, while switches 100a' . . . 100n' are clocked by a complementary signal of the output bit from quantizer 56. Quantizer 56 may generate both an output bit and complementary bit for each of its bits, or the complementary signal of each output bit may be otherwise created, such as by an inverter.

Figure 6:
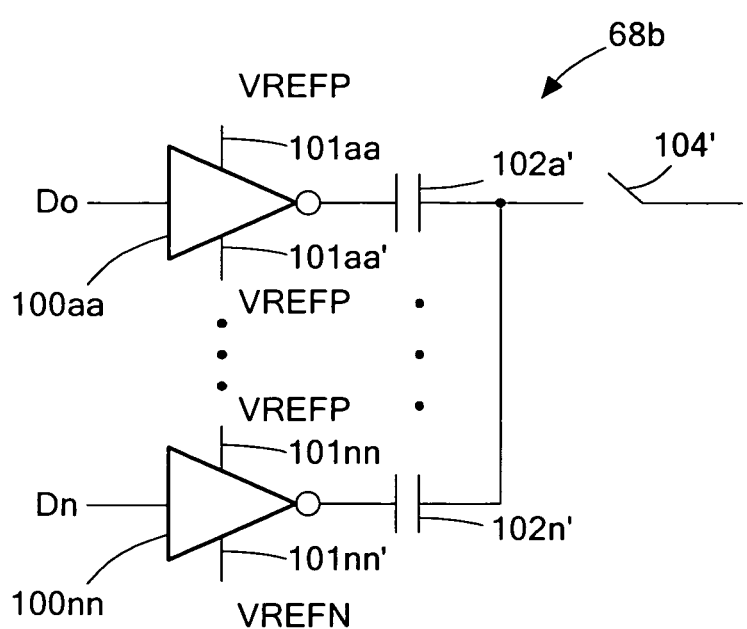
FIG. 6 is a circuit diagram of another embodiment of the switched capacitor DAC used with the continuous-time delta sigma converter of FIG. 4.

In another embodiment of switched capacitor DAC 68*b*, FIG. 6, the input to switch 68*b* is a single ended digital control code from quantizer 56. The switched capacitor DAC 68*b* includes a plurality of inverters 100*aa* ... 100*nn* each responsive to an output bit from quantizer 56 and having as its supply voltage one or more reference voltages such as reference voltage VREFP 101*aa* ... 101*nn* and VREFN 101*aa*' ... 101*nn*'. In this embodiment, capacitors 102*aa*' ... 102*nn*' are each responsive to the output of one of the inverters 100*aa* ... 100*nn*. An output switch 104' is responsive to each of capacitors 102*a*' ... 102*n*', is clocked by a clock signal and provides an output to the input at integrator 54*d* on line 106.

With the switch capacitor DACs 68*a* and 68*b* of FIGS. 5 and 6, data bits can arrive to the DAC any time up until the clock signal CLK goes high. When the clock signal goes high, switch 104 or 104' is turned on and charges are transmitted to the input of integrator 54*d* through its feedback capacitor. When clock CLK is low, no charge is output from the DACs 68*a* or 68*b*. DACs 68*a* and 68*b* have very low set-up times and clock-to-output time which make them suitable for high speed operation. Moreover, since there is no reset operation taking place with DACs 68*a* and 68*b*, only the difference between consecutive input codes leads to a charged transmission thus performing a differentiation with respect to the code at the output.

Since the two DACs 68 and 70 shown in FIG. 4 are operating on an anti-clock phase, they have the benefit of not loading the amplifier and integrator 54*d* when not in use. This further increases the feedback factor for the amplifier of integrator 54*d* such that a higher maximum loop bandwidth is possible.

While only a single output switch 104 and 104' are shown in FIGS. 5 and 6, each capacitor 102*a* ... 102*n* and 102*a*' ... 102*n*' could have its own output switch controlled by a clock signal, thereby connecting the corresponding capacitor to the output DACs 68*a* or 68*b*.

With the subject invention, the output of quantizer 56 is differentiated twice before being provided to integrator 54*d*. As described above, differentiation as an operator can be done in the discrete time domain or in the continuous time domain. Differentiation in the discrete time domain can be done by taking the difference between two consecutive samples/values in the time domain. This can be expressed (differentiation abbreviated as Diff) with a Z-transform as;

$$\text{Diff}=1-Z^{-1} \quad (1.1)$$

In the continuous time domain, this is expressed instead using the Laplacian differentiation operator S, such that the operation can be expressed as;

$$\text{Diff}=S \quad (1.2)$$

So to bypass an integrator, one of the two aforementioned operations are used.

Figure 7:
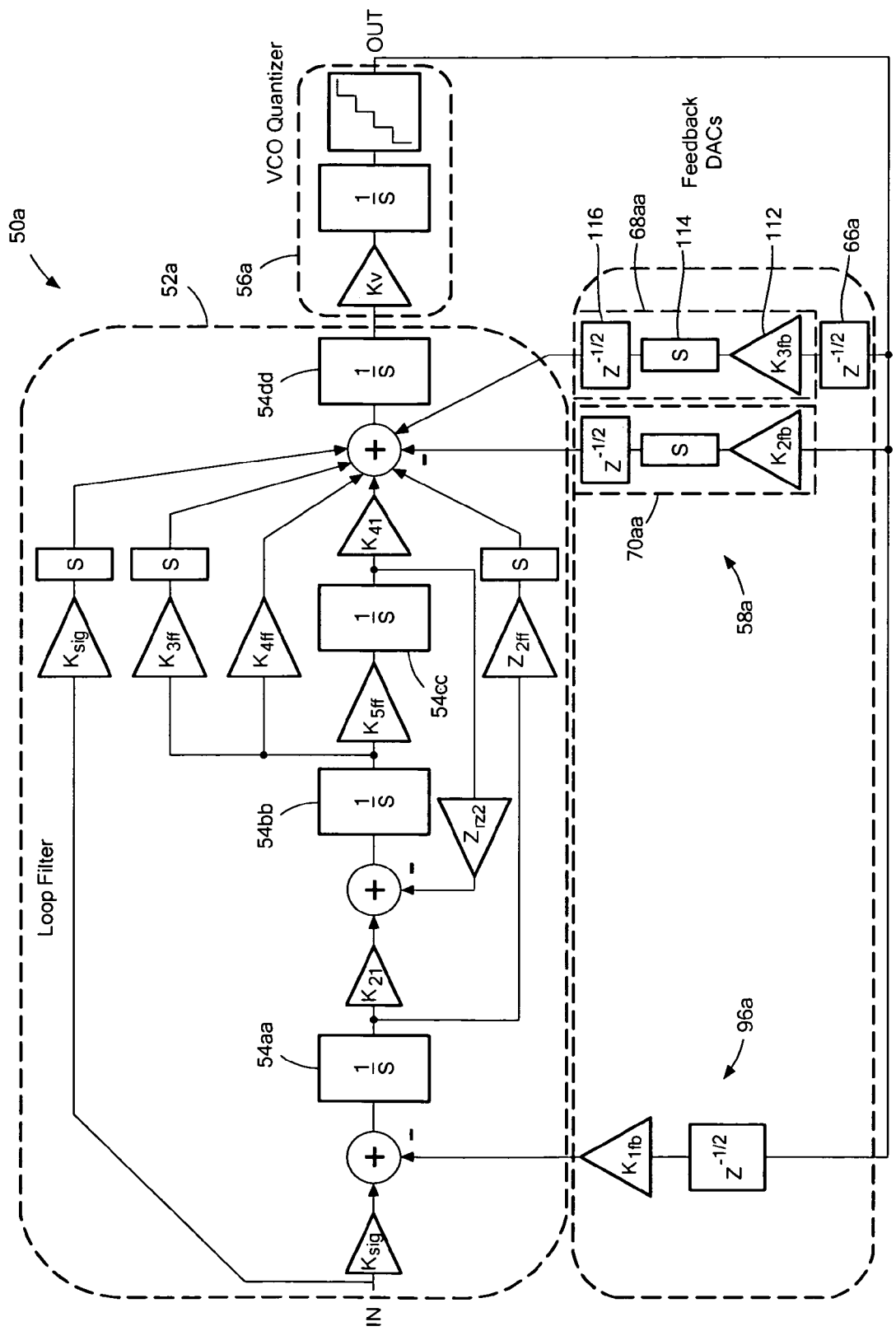
FIG. 7 is a signal flow diagram of the continuous-time delta sigma converter of FIG. 4.

Signal flow graph 110, FIG. 7, exemplifies the ideal mathematical behavior of delta sigma modulator 50 of FIG. 4. Signal flow graph 110 does not take into account non-ideal behavior associated with each building block but merely its functionality, and does not describe if a signal is analog or digital.

A typical delta sigma modulator 50*a* includes loop filter 52*a*, quantizer 56*a* and feedback paths 58*a* and 96*a* from the quantizer. Delta sigma modulator 50*a* has a total of five integrators and is a fifth order delta sigma modulator. Loop filter 52*a* includes four integrators 54*aa*-*dd*. VCO Quantizer 56*a* is configured an integrator and a quantizer.

In the subject invention, feedback path 58*a* is provided to the input of the last integrator 54*dd* of loop filter 52*a*. Signals originating from the input to and inside the loop filter are also provided to integrator 54*dd* which sums the input signals. However, these paths must then be subjected to differentiation such that they bypass the integration from integrator 54*dd*. Feedforward capacitances 78*a*-*c* and 80*a*-*c* differentiate these signals using a capacitive summing approach and are able to operate at higher speeds than conventional resistive approaches as used in the prior art.

Delay circuit 66*a* implements differentiation in the discrete time domain according to equation (1.1). Delay circuit 66*a* may delay its input signal less than one sample (e.g., z-0.5) due to the excess loop delay caused by quantizer, feedback DACs and available dock sources/control signals. Delay circuit 66*a* may be implemented by delay circuit 66 that delays the input signal from the quantizer 56 by approximately one half a clock cycle.

The operation of the differentiating feedback DACs 68*a* and 70*a* may be represented by DACs 68*aa* and 70*aa* which each include a gain element 112 in series with a continuous time differentiator 114 (in accordance with equation (1.2)) and a delay element 116. Continuous time differentiator 114 may be realized by the combination of the capacitor and switch connecting to a voltage reference in FIG. 5. Delay element 116 may be realized by switch 104 controlled by a clock signal. This differentiation by DACs 68*aa* and 70*aa* in the continuous time domain bypasses the integration of the fourth integrator 54*dd* (as seen from the input towards the output).

In this manner, delay element 66 and DACs 68 and 70, FIG. 4, perform differentiation in the discrete time domain according to equation (1.1), and DACs 68 and 70 perform continuous time differentiation in accordance with equation (1.2) prior to being subjected to the integration of the integrator 54*d*. Thus, the quantized signal is differentiated twice before being provided to fourth integrator 54*d* and a direct feedback path is realized.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A continuous-time delta sigma converter, comprising:
   a loop filter including a plurality of serially coupled integrators including a first integrator responsive to an input of the Delta Sigma converter and a last integrator responsive to a first feedback loop and providing an integrated output signal; and
   a voltage controlled oscillator (VCO) based quantizer responsive to the loop filter for integrating the integrated output signal and providing a digital output signal;

the first feedback loop including a first time delay circuit responsive to the output of the quantizer and at least one switched capacitor digital to analog converter (DAC) responsive to the first time delay circuit, the first feedback loop configured to differentiate the digital output signal twice and provide the last integrator of the loop filter with a double differentiated analog signal to reduce excess loop delay.

2. The delta sigma converter of claim 1 in which at least one switched capacitor DAC includes a first switched capacitor DAC responsive to the first time delay circuit, and a second switched capacitor DAC responsive to the output of the quantizer.

3. The delta sigma converter of claim 2 in which each switched capacitor DAC includes:
- a plurality of switches each responsive to a reference voltage;
- a plurality of capacitances each responsive to at least one of the plurality of switches; and
- at least one output switch responsive to the plurality of capacitances and a clock signal for providing an output signal from the switched capacitor DAC.

4. The delta sigma converter of claim 3 in which each of the capacitances are responsive to first and second switches which are respectively responsive to first and second reference voltages.

5. The delta sigma converter of claim 4 in which the first switch is clocked by an output bit of the quantizer and the second switch is clocked by a complementary signal of the output bit.

6. The delta sigma converter of claim 3 in which each switch includes an inverter responsive to an output of the quantizer, the reference voltage is a supply voltage for the inverter, and each of the capacitances are responsive to a corresponding inverter.

7. The delta sigma converter of claim 1 in which the first time delay circuit delays the output signal from the quantizer by approximately half of a clock cycle.

8. The delta sigma converter of claim 1 in which the loop filter includes second and third integrators coupled in series between the first and last integrators.

9. The delta sigma converter of claim 8 in which the loop filter includes three feedforward capacitances each coupled between an input of one of the three integrators and the output of the loop filter.

10. The delta sigma converter of claim 1 in which the loop filter includes one or more feedforward capacitances coupled to the output of the loop filter.

11. The delta sigma converter of claim 1 in which the loop filter includes a resonator stage.

12. The delta sigma converter of claim 1 further including a second feedback loop coupled between the output of the quantizer and an input of the loop filter, the second feedback loop including a current steering DAC responsive to the quantizer.

13. The delta sigma converter of claim 12 in which the second feedback loop further includes a second time delay circuit coupled between the quantizer and the current steering DAC for delaying the output signal from the quantizer by approximately half of a clock cycle.

14. A continuous-time delta sigma converter, comprising:
- a loop filter including four serially coupled integrators including a first integrator responsive to an input of the Delta Sigma converter and a fourth integrator responsive to a first feedback loop and providing an integrated output signal; and
- a voltage controlled oscillator (VCO) based quantizer responsive to the loop filter for integrating the integrated output signal and providing a digital output signal;
- the first feedback loop configured to differentiate the digital output signal twice and provide the fourth integrator with a double differentiated analog signal to reduce excess loop delay, the first feedback loop including:
  - a first time delay circuit responsive to the output of the quantizer,
  - a first switched capacitor DAC responsive to the first time delay circuit, and
  - a second switched capacitor DAC responsive to the output of the quantizer.

15. The delta sigma converter of claim 14 in which the first time delay circuit delays the output signal from the quantizer by approximately half of a clock cycle.

16. The delta sigma converter of claim 14 in which the first and second switched capacitor DACs differentiate in a continuous time domain, and in which the first time delay circuit delays the digital output signal and the output of the first switched capacitor DAC is subtracted from the output of the second switched capacitor DAC such that differentiation also occurs in a discrete time domain.

17. The delta sigma converter of claim 16 in which the loop filter includes one or more feedforward capacitances coupled to the output of the loop filter.

18. The delta sigma converter of claim 17 in which there are three feedforward capacitances each coupled between an input of one of the three integrators and the output of the loop filter.

19. The delta sigma converter of claim 14 further including a second feedback loop coupled between the output of the quantizer and an input of the loop filter, the second feedback loop including a current steering DAC responsive to the quantizer.

20. The delta sigma converter of claim 19 in which the second feedback loop further includes a second time delay circuit coupled between the quantizer and the current steering DAC for delaying the output signal from the quantizer by approximately half of a clock cycle.

21. A switched capacitor digital to analog converter (DAC) responsive to a quantizer in a feedback loop of a continuous-time delta sigma converter, the switched capacitor DAC comprising:
- a plurality of switches each responsive to a reference voltage;
- a plurality of capacitances each responsive to a first switch and a second switch which are respectively responsive to first and second reference voltages;
- at least one output switch responsive to the plurality of capacitances and a clock signal for providing an output signal from the switched capacitor DAC; and
- the first switch clocked by an output bit of the quantizer and the second switch clocked by a complementary signal of the output bit.

22. The delta sigma converter of claim 21 in which there is only one output switch.

23. The delta sigma converter of claim 21 in which each switch includes an inverter responsive to an output of the quantizer, the reference voltage is a supply voltage for the inverter, and each of the capacitances are responsive to a corresponding inverter.

* * * * *